(12) United States Patent
Dalveren et al.

(10) Patent No.: US 10,613,166 B2
(45) Date of Patent: Apr. 7, 2020

(54) APPARATUS AND METHOD FOR DECOUPLING AN MRI RECEIVE COIL

(71) Applicant: General Electric Company, Schenectady, NY (US)

(72) Inventors: Taylan Dalveren, North Ridgeville, OH (US); Dan Kenrick Spence, Hartland, WI (US); Limin Feng, Solon, OH (US); Gabriel Searles, Ravenna, OH (US); Michael Czigler, Cleveland, OH (US)

(73) Assignee: General Electric Company, Schenectady, NY (US)

( * ) Notice: Subject to any disclaimer, the term of this patent is extended or adjusted under 35 U.S.C. 154(b) by 1360 days.

(21) Appl. No.: 14/715,044

(22) Filed: May 18, 2015

(65) Prior Publication Data

US 2016/0341804 A1   Nov. 24, 2016

(51) Int. Cl.
*G01R 33/36* (2006.01)
*G01R 33/341* (2006.01)
*G01R 33/54* (2006.01)

(52) U.S. Cl.
CPC ...... *G01R 33/3657* (2013.01); *G01R 33/3628* (2013.01)

(58) Field of Classification Search
CPC .............. G01R 33/36; G01R 33/3628; G01R 33/3657; G01R 33/0286
See application file for complete search history.

(56) References Cited

U.S. PATENT DOCUMENTS

| 4,855,680 | A | 8/1989 | Arakawa et al. |
| 5,278,505 | A * | 1/1994 | Arakawa ............... G01R 33/341 324/311 |
| 6,927,575 | B2 | 8/2005 | Burl et al. |
| 7,336,074 | B2 | 2/2008 | Yang et al. |
| 7,560,934 | B1 | 7/2009 | Chmielewski et al. |
| 2012/0081115 | A1* | 4/2012 | Reykowski ........ G01R 33/3415 324/309 |
| 2014/0184217 | A1* | 7/2014 | Bulumulla ......... G01R 33/3635 324/307 |

* cited by examiner

*Primary Examiner* — Son T Le
(74) *Attorney, Agent, or Firm* — Ziolkowski Patent Solutions Group, SC; Jean K. Testa

(57) ABSTRACT

An apparatus for decoupling a receive coil from a transmit coil includes a tuning circuit connected electrically with the receive coil and a MEMS switch connected electrically in parallel with the tuning circuit, and operable to line up or to bypass the tuning circuit by opening or closing the MEMS switch. The apparatus further includes a control circuit operatively connected with the MEMS switch and operable to open or to close the MEMS within a window of time responsive to energization of the transmit coil to transmit a signal.

20 Claims, 3 Drawing Sheets

APPARATUS AND METHOD FOR DECOUPLING AN MRI RECEIVE COIL

BACKGROUND

Technical Field

Embodiments of the invention relate generally to magnetic resonance imaging (MRI). Particular embodiments relate to methods and apparatus for limiting ("decoupling") unwanted electromagnetic interaction or coupling of a receive coil with a transmit coil.

Discussion of Art

Generally, magnetic resonance images are obtained by imposing on a target object, such as a patient's body, a large uniform magnetic field ("B0") from a "field" or "polarizing" coil. This large uniform field substantially aligns the quantum spins of protons in the molecules within the target object, although the spins of protons within chemically distinct molecules will continue to precess at distinct Larmor frequencies. By briefly imposing a pulsed RF field ("B1") from a "transmit coil," generally transverse to B0, it is possible to excite the protons of molecules with spins that precess at a Larmor frequency matching the pulsed RF. As the excited protons relax back to their lower energy normal state, they emit RF energy that can be detected by a "receive coil," which may be the same as, or separate from, the transmit coil. The detected RF energy is recorded as intensity data that then is processed, by known means, so as to obtain a visual approximation or image of where and how the various chemicals are disposed within the target object.

Often, the transmit and receive coils are a single mechanical and electrical structure or array of structures, with transmit/receive mode switchable by auxiliary circuitry. For enhanced image quality, however, it may be desirable to provide a receive coil that is mechanically and electrically isolated from the transmit coil. In such case it is highly desirable to provide that the receive coil, in its receive mode, will be electromagnetically coupled to and resonant with the RF pulse that was provided from the transmit coil. Further, it may be desirable to provide that the receive coil is electromagnetically decoupled from and therefore not resonant with the transmit coil, during actual transmission of the RF pulse. Such decoupling averts a potential problem of noise produced within the auxiliary circuitry when the receive coil couples to the full power of the RF pulse.

In view of the above, it is deemed desirable to provide apparatus and methods for coupling and decoupling a receive coil rapidly and with relatively low circuit losses. Such apparatus and methods might also be helpful toward operation of RF transceivers, generally.

BRIEF DESCRIPTION

Aspects of the invention implement a method for coupling and decoupling a receive coil with a transmit coil. The method includes maintaining the receive coil decoupled from the transmit coil; detecting an RF pulse transmission via the transmit coil; responsive to the RF pulse transmission, coupling the receive coil to the transmit coil during a window of time; and after the window of time, decoupling the receive coil from the transmit coil.

Embodiments of the invention provide an apparatus for decoupling a receive coil from a transmit coil. The apparatus includes a tuning circuit connected electrically with the receive coil; a MEMS switch connected electrically in parallel with the tuning circuit, and operable to line up or to bypass the tuning circuit by opening or closing the MEMS switch; and a control circuit operatively connected with the MEMS switch and operable to open or to close the MEMS switch for lining up or bypassing the tuning circuit, within a window of time responsive to energization of the transmit coil to transmit a signal.

Other embodiments provide an apparatus for decoupling a receive coil from a transmit coil. The apparatus includes a plurality of tuning elements connected electrically with the receive coil; a plurality of MEMS switches each connected electrically with a respective one of the plurality of tuning elements, and operable to line up or to bypass the respective tuning circuit by opening or closing the MEMS switch; and a control circuit operatively connected with the MEMS switch and operable to open or to close each of the plurality of MEMS switches, so as to tune the receive coil to any of one or more non-receive frequencies for decoupling the receive coil from the transmit coil, or to a receive frequency for coupling the receive coil to the transmit coil.

Yet other embodiments provide a receive coil array apparatus, which includes a plurality of receive coils; a plurality of tuning elements each connected electrically with a respective one of the receive coils; a plurality of MEMS switches each connected electrically with a respective one of the plurality of tuning elements, and operable to line up or to bypass the respective tuning circuit by opening or closing the MEMS switch.

DRAWINGS

The present invention will be better understood from reading the following description of non-limiting embodiments, with reference to the attached drawings, wherein below:

DETAILED DESCRIPTION

Figure 1:
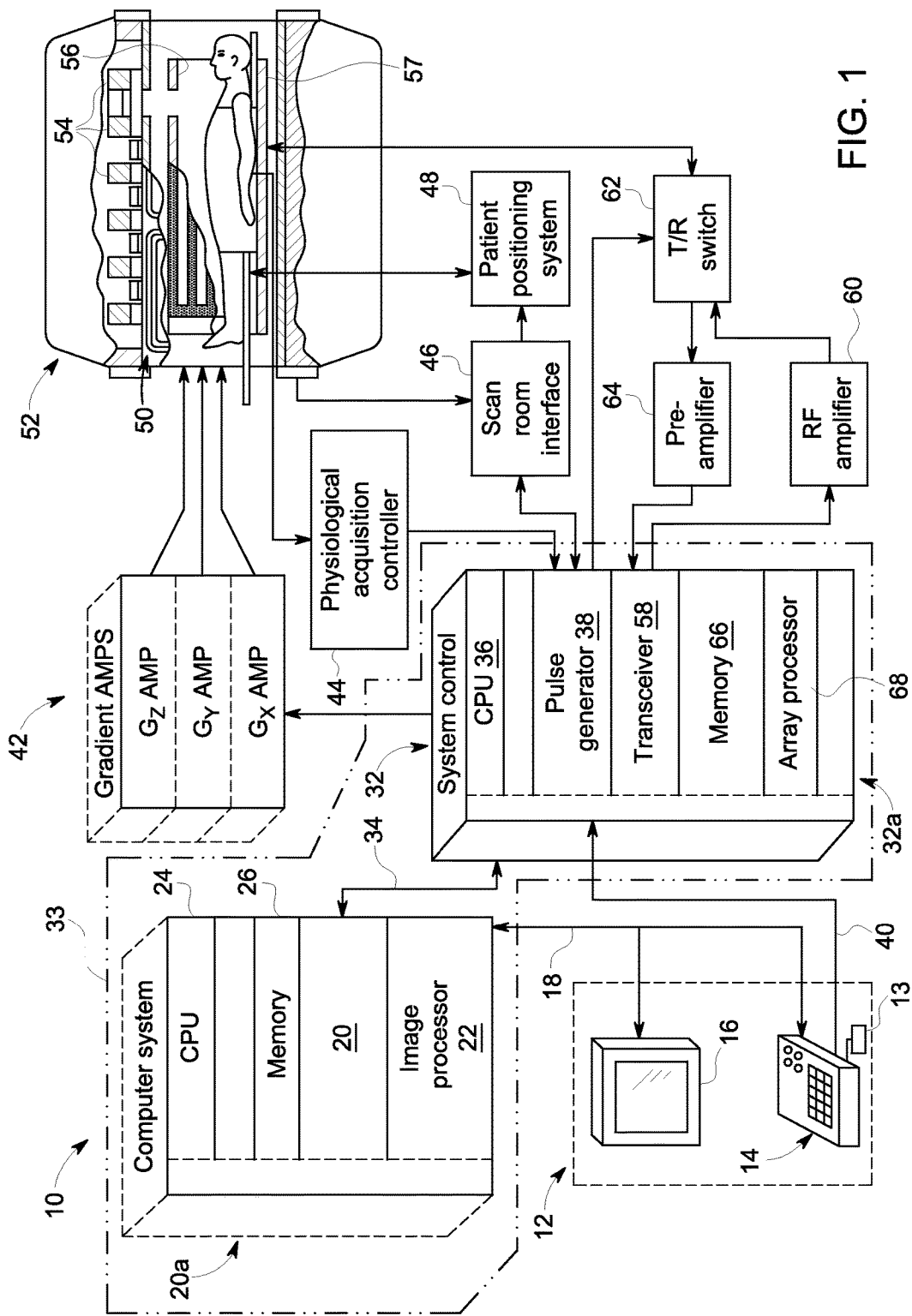
FIG. 1 depicts schematically an exemplary magnetic resonance imaging (MRI) system that incorporates embodiments of the invention.

Reference will be made below in detail to exemplary embodiments of the invention, examples of which are illustrated in the accompanying drawings. Wherever possible, the same reference characters used throughout the drawings refer to the same or like parts, without duplicative description. Although exemplary embodiments of the present invention are described with respect to an MRI body (transmit) coil and an MRI surface (receive) coil array, embodiments of the invention also may be applicable for use with parallel-coil RF transceivers, generally.

As used herein, the terms "substantially," "generally," and "about" indicate conditions within reasonably achievable manufacturing and assembly tolerances, relative to ideal desired conditions suitable for achieving the functional purpose of a component or assembly.

FIG. 1 shows major components of an exemplary magnetic resonance imaging (MRI) system 10 that incorporates embodiments of the present invention. The operation of the system is controlled from an operator console 12, which includes a keyboard or other input device 13, a control panel 14, and a display screen 16. The input device 13 can include a mouse, joystick, keyboard, track ball, touch activated screen, light wand, voice control, or any similar or equivalent input device, and may be used for interactive geometry prescription. The console 12 communicates through a link 18 with a separate computer system 20 that enables an operator to control the production and display of images on the display screen 16. The computer system 20 includes a number of modules that communicate with each other through a backplane 20a.

The modules of the computer system 20 include an image processor module 22, a CPU module 24 and a memory module 26 that may include a frame buffer for storing image data arrays. The computer system 20 is linked to archival media devices, permanent or back-up memory storage or a network for storage of image data and programs, and communicates with a separate MRI system control 32 through a high-speed signal link 34. The computer system 20 and the MRI system control 32 collectively form an "MRI controller" 33.

The MRI system control 32 includes a set of modules connected together by a backplane 32a. These include a CPU module 36 as well as a pulse generator module 38. The CPU module 36 connects to the operator console 12 through a data link 40. It is through link 40 that the MRI system control 32 receives commands from the operator to indicate the scan sequence that is to be performed. The CPU module 36 operates the system components to carry out the desired scan sequence and produces data which indicates the timing, strength and shape of the RF pulses produced, and the timing and length of the data acquisition window. The CPU module 36 connects to several components that are operated by the MRI controller 33, including the pulse generator module 38 (which controls a gradient amplifier 42, further discussed below), a physiological acquisition controller ("PAC") 44, and a scan room interface circuit 46.

The CPU module 36 receives patient data from the physiological acquisition controller 44, which receives signals from a number of different sensors connected to the patient, such as ECG signals from electrodes attached to the patient. And finally, the CPU module 36 receives from the scan room interface circuit 46, signals from various sensors associated with the condition of the patient and the magnet system. It is also through the scan room interface circuit 46 that the MRI controller 33 commands a patient positioning system 48 to move the patient or client C to a desired position for the scan.

The pulse generator module 38 operates the gradient amplifiers 42 to achieve desired timing and shape of the gradient pulses that are produced during the scan. The gradient waveforms produced by the pulse generator module 38 are applied to the gradient amplifier system 42 having Gx, Gy, and Gz amplifiers. Each gradient amplifier excites a corresponding physical gradient coil in a gradient coil assembly, generally designated 50, to produce the magnetic field gradients used for spatially encoding acquired signals. The gradient coil assembly 50 forms part of a magnet assembly 52, which also includes a polarizing magnet 54 (which, in operation, provides a homogeneous longitudinal magnetic field B0 throughout a target volume 55 that is enclosed by the magnet assembly 52) and a whole-body (transmit and receive) RF coil 56 (which, in operation, provides a transverse magnetic field B1 that is generally perpendicular to B0 throughout the target volume 55).

In an embodiment of the invention, RF coil 56 is a multi-channel coil. The MRI apparatus 10 also includes a surface (receive) coil 57, which may be single- or multi-channel. A transceiver module 58 in the MRI system control 32 produces pulses that are amplified by an RF amplifier 60 and coupled to the RF coil 56 by a transmit/receive switch 62. The resulting signals emitted by the excited nuclei in the patient may be sensed by the same RF coil 56, as well as by the dedicated receive coil 57, and coupled through the transmit/receive switch 62 to a preamplifier 64. The amplified MR signals are demodulated, filtered, and digitized in the receiver section of the transceiver 58. The transmit/receive switch 62 is controlled by a signal from the pulse generator module 32 to electrically connect the RF amplifier 60 to the coil 56 during the transmit mode and to connect the preamplifier 64 to the coil 56 during the receive mode. The transmit/receive switch 62 can also enable the surface RF coil 57 to be used in either transmit mode or receive mode.

Conventionally, the surface coil 57 in its receive mode would be coupled to (resonant at the same frequency as) the body coil 56, so as to best receive echoes of the RF pulse transmitted during the transmit mode. However, in case the surface RF coil 57 is not being used for transmission, then it would be necessary to decouple the surface coil 57 from the body coil 56 while the body coil 56 is transmitting the RF pulse. Conventionally, decoupling would be accomplished using diodes to activate a detuning circuit operatively connected with the surface coil 57. Diode-activated detuning circuits are known to be slow and lossy. In contrast, embodiments of the invention provide apparatus and methods for decoupling the surface coil 57 more quickly and with less loss.

After the multi-channel RF coil 56 and/or the surface coil 57 picks up the RF signals produced from excitation of the target, the transceiver module 58 digitizes these signals. The MRI controller 33 then processes the digitized signals by Fourier transform to produce k-space data, which then is transferred to a memory module 66, or other computer readable media, via the MRI system control 32. "Computer readable media" may include, for example, structures configured so that electrical, optical, or magnetic states may be fixed in a manner perceptible and reproducible by a conventional computer: e.g., text or images printed to paper or displayed on a screen, optical discs, or other optical storage media; "flash" memory, EEPROM, SDRAM, or other electrical storage media; floppy or other magnetic discs, magnetic tape, or other magnetic storage media.

A scan is complete when an array of raw k-space data has been acquired in the computer readable media 66. This raw k-space data is rearranged into separate k-space data arrays for each image to be reconstructed, and each of these is input to an array processor 68 which operates to Fourier transform the data into an array of image data. This image data is conveyed through the data link 34 to the computer system 20 where it is stored in memory. In response to commands received from the operator console 12, this image data may be archived in long-term storage or it may be further processed by the image processor 22 and conveyed to the operator console 12 and presented on the display 16.

Figure 2:
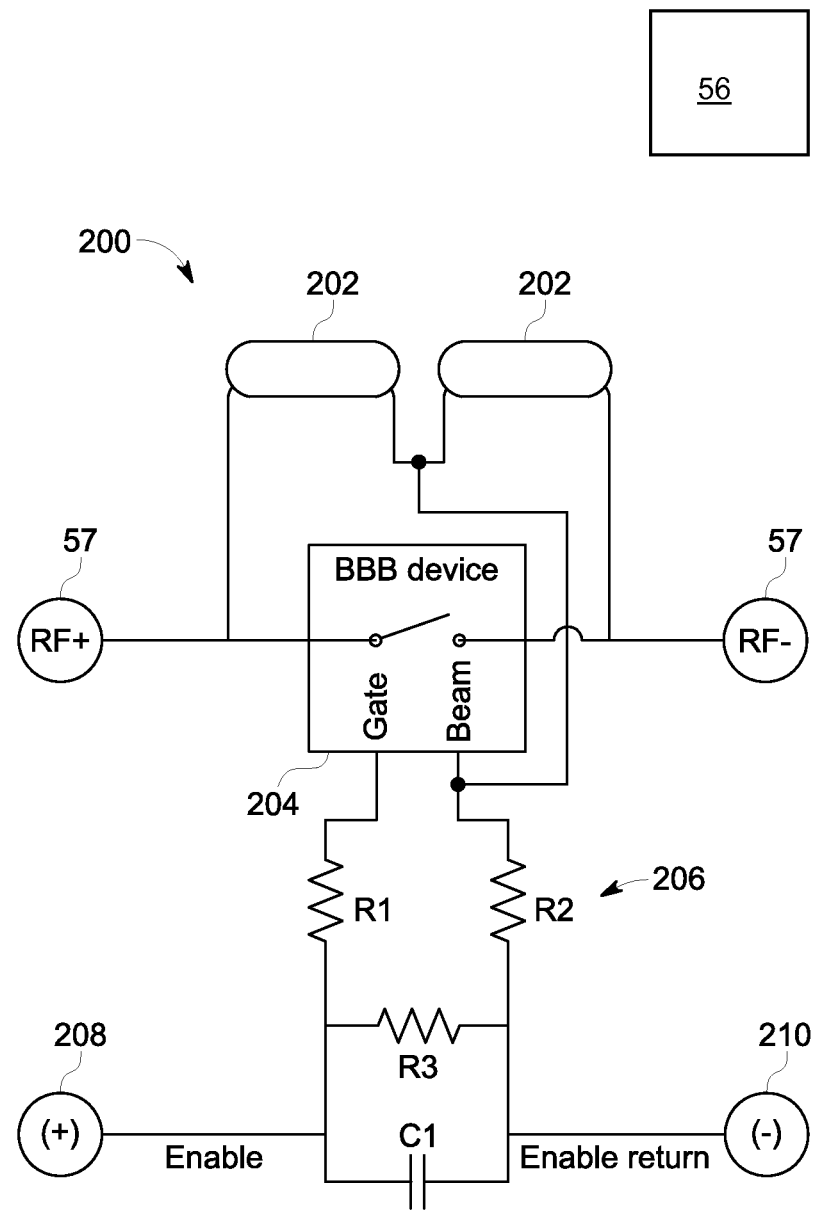
FIG. 2 shows schematically a tuning circuit that is operatively connected with a receive coil of the MRI system shown in FIG. 1, according to embodiments of the invention.

Referring to FIG. 2, embodiments of the invention provide a broadband blocking device (tuning circuit) 200, which incorporates a SPST single pole single throw electrostatic switch using microelectromechanical system (MEMS) technology (a "MEMS switch") 204 to activate (line up) or bypass (deactivate) tuning elements 202 that are operatively connected with the surface coil 57. Generally, the tuning elements 202 are reactive elements, although some of the tuning elements may be substantially resistive, i.e., with minimal reactance.

As shown in FIG. 2, the MEMS switch 204 can be closed to substantially bypass the tuning elements 202, thereby tuning the surface (receive) coil 57 to a "receive frequency"

that is resonant with (coupled to) the natural frequency of the body (transmit) coil 56 (FIG. 1). On the other hand, the MEMS switch 204 can be opened to line up the tuning elements 202 in series with the receive coil 57, thereby tuning the receive coil to a "non-receive frequency" that is not resonant with (decoupled from) the transmit coil 56. Multiple MEMS switches 204 may be provided. For example, at least two MEMS switches may be connected electrically in parallel with the tuning circuit, so that each of the plurality of tuning elements may be connected electrically in parallel with at least one of the plurality of MEMS switches. Alternatively, the plurality of tuning elements may be connected electrically in parallel; and each of the plurality of tuning elements may be connected electrically in series with at least one of the plurality of MEMS switches.

For example, a suitable non-receive frequency differs sufficiently from the receive frequency so that, when the receive coil 57 is tuned to the non-receive frequency and is driven by the receive frequency, the response amplitude of the receive coil 57 will be at least 4 dB less than it would be when tuned to the receive frequency and driven by the receive frequency. In certain embodiments, the response amplitude of the receive coil 57 will be at least 10 dB less, when tuned to a non-receive frequency, than it would be when tuned to the receive frequency. Ordinary skilled workers will appreciate the receive coil 57 may be tuned to any of a plurality of non-receive frequencies that are not resonant with the body (transmit) coil 56.

Figure 3:
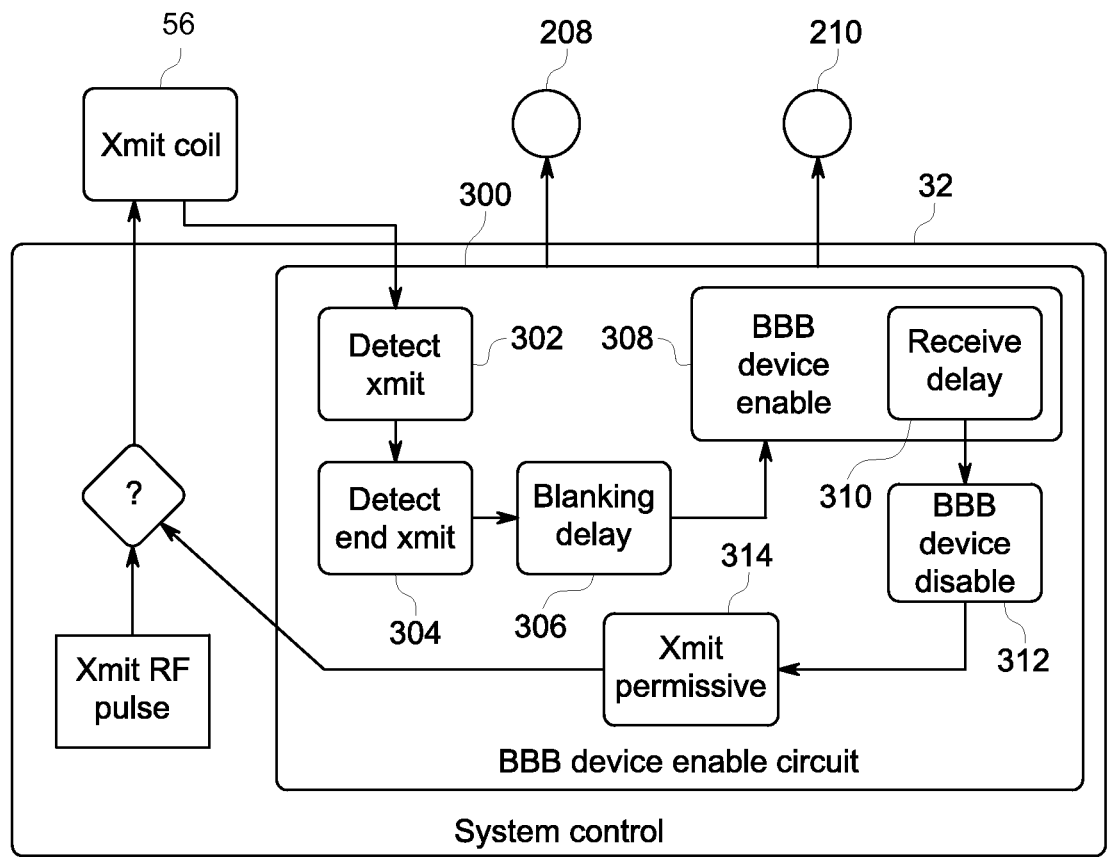
FIG. 3 shows schematically a control circuit and method for operating the tuning circuit shown in FIG. 2, according to embodiments of the invention.

Still referring to FIG. 2, the broadband blocking device 200 further includes a resistive balance network 206, by which GATE and BEAM terminals of the MEMS switch 204 are connected to an enable terminal 208 and to an enable return terminal 210. Referring now to FIG. 3, the terminals 208, 210 of the broadband blocking device 200 receive command signals from an enable circuit 300, which is implemented either in hardware or in software within the MRI system control 32.

The control circuit 300 implements a method that includes detecting 302 an RF transmit mode of the transmit coil 56, detecting 304 an end or discontinuation of the transmit mode (and therefore clearing a transmit permissive state of the control circuit), and enabling 308 the MEMS switch 204—i.e., coupling the receive coil 57 to the transmit coil 56, by bypassing the tuning (decoupling) elements 202. The method may also include a blanking delay 306 between the end of the transmit mode and the enabling 308 of the MEMS switch 204.

Further, the control circuit 300 enables the MEMS switch 204 only during a receive delay 310, whereafter, the control circuit disables 312 the MEMS switch 204—i.e., once again decoupling the receive coil 57 from the transmit coil 56. Thus, the blanking delay 306 and the receive delay 310 together define a "window of time," less than one scan cycle in length, during which the receive coil 57 is coupled to the transmit coil 56 in order to detect RF echoes generated from the pulse previously sent by the transmit coil 56. Also during this window of time, the control circuit 300 is in a transmit non-permissive state. Once the control circuit 300 has caused decoupling of the receive coil 57, then the control circuit sets 314 a transmit permissive state.

Advantageously, the MRI system control 32 may evaluate the transmit permissive state of the control circuit 300 when determining whether to permit or interrupt transmission of an RF pulse via the transmit coil 56. In other words, the MRI system control 32 may condition RF pulse transmission on whether the control circuit 300 has caused decoupling of the receive coil 57 from the transmit coil 56. This mode of operation can avert noise or damage that might otherwise be caused by the receive coil 57 being coupled to the transmit coil 56 during an RF pulse transmission.

Therefore, embodiments of the invention provide an apparatus for decoupling a receive coil from a transmit coil. The apparatus includes a tuning circuit connected electrically with the receive coil; a MEMS switch connected electrically in parallel with the tuning circuit, and operable to line up or to bypass the tuning circuit by opening or closing the MEMS switch; and a control circuit operatively connected with the MEMS switch and operable to open or to close the MEMS switch for lining up or bypassing the tuning circuit, within a window of time responsive to energization of the transmit coil to transmit a signal. The tuning circuit may include a plurality of tuning elements, and the MEMS switch may include a plurality of MEMS switches each connected electrically with a respective one of the plurality of tuning elements, and operable to line up or to bypass the respective tuning circuit by opening or closing the MEMS switch. Thus, the control circuit may be operable to open or to close each of the plurality of MEMS switches, so as to tune the receive coil to one of a plurality of receive frequencies for coupling or decoupling the receive coil from the transmit coil. The plurality of tuning elements may be connected electrically in series; and each of the plurality of tuning elements may be connected electrically in parallel with at least one of the plurality of MEMS switches. For example, at least two MEMS switches may be connected electrically in parallel with the tuning circuit. Alternatively, the plurality of tuning elements may be connected electrically in parallel; and each of the plurality of tuning elements may be connected electrically in series with at least one of the plurality of MEMS switches. In certain embodiments, at least one of the plurality of tuning elements may be a reactive element. For example, the entire tuning circuit may be a reactive element. In such case the single reactive element may nevertheless be multiply tapped by a plurality of MEMS switches. The control circuit may be operatively connected with the MEMS switch and may be operable to close the MEMS switch for bypassing the tuning circuit, within the window of time following energization of the transmit coil, so as to couple the receive coil to the transmit coil during only that window of time.

Other embodiments provide an apparatus for decoupling a receive coil from a transmit coil. The apparatus includes a plurality of tuning elements connected electrically with the receive coil; a plurality of MEMS switches each connected electrically with a respective one of the plurality of tuning elements, and operable to line up or to bypass the respective tuning circuit by opening or closing the MEMS switch; and a control circuit operatively connected with the MEMS switch and operable to open or to close each of the plurality of MEMS switches, so as to tune the receive coil to any of one or more non-receive frequencies for decoupling the receive coil from the transmit coil, or to a receive frequency for coupling the receive coil to the transmit coil. The plurality of tuning elements may be connected electrically in series, and each of the plurality of tuning elements may be connected electrically in parallel with at least one of the plurality of MEMS switches. For example, at least two MEMS switch may be connected electrically in parallel with each of the plurality of tuning elements. The control circuit may be operable to open or to close each of the plurality of MEMS switches for bypassing some or all of the plurality of tuning elements, within a window of time following energization of the transmit coil, so as to couple the receive coil to the transmit coil during only said window of time. The control circuit may be operatively connected to permit transmission of an RF pulse via the transmit coil, or to prevent transmission of the RF pulse during said window of time. The control circuit may be operable to close the plurality of MEMS for bypassing the plurality of tuning elements so as to couple the receive coil to the transmit coil. At least one of the plurality of tuning elements may be a reactive element.

Yet other embodiments provide a receive coil array apparatus, which includes a plurality of receive coils; a plurality of tuning elements each connected electrically with a respective one of the receive coils; a plurality of MEMS switches each connected electrically with a respective one of the plurality of tuning elements, and operable to line up or to bypass the respective tuning circuit by opening or closing the MEMS switch. The receive coil array may be provided with a control circuit that is operatively connected with each of the plurality of MEMS switches and operable to open or close each of the plurality of MEMS switches, so as to tune the receive coil to any of one or more non-receive frequencies for decoupling the receive coil from the transmit coil, or to a receive frequency for coupling the receive coil to the transmit coil. The control circuit may be operable to open or close the MEMS switches for tuning the receive coil, so as to couple the receive coil to the transmit coil during only a window of time following energization of the transmit coil. The control circuit may be operatively connected to permit transmission of an RF pulse via the transmit coil, or to prevent transmission of the RF pulse during said window of time. The control circuit may be operable to close the plurality of MEMS for bypassing the plurality of tuning elements so as to couple the receive coil to the transmit coil.

Further embodiments implement a method for coupling and decoupling a receive coil with a transmit coil. The method includes maintaining the receive coil decoupled from the transmit coil; detecting an RF pulse transmission via the transmit coil; responsive to the RF pulse transmission, coupling the receive coil to the transmit coil during a window of time; and after the window of time, decoupling the receive coil from the transmit coil.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the invention without departing from its scope. While the dimensions and types of materials described herein are intended to define the parameters of the invention, they are by no means limiting and are exemplary embodiments. Many other embodiments will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, terms such as "first," "second," "third," "upper," "lower," "bottom," "top," etc. are used merely as labels, and are not intended to impose numerical or positional requirements on their objects. Further, the limitations of the following claims are not written in means-plus-function format and are not intended to be interpreted based on 35 U.S.C. § 112, sixth paragraph, unless and until such claim limitations expressly use the phrase "means for" followed by a statement of function void of further structure.

This written description uses examples to disclose several embodiments of the invention, including the best mode, and also to enable one of ordinary skill in the art to practice embodiments of the invention, including making and using any devices or systems and performing any incorporated methods. The patentable scope of the invention is defined by the claims, and may include other examples that occur to one of ordinary skill in the art. Such other examples are intended to be within the scope of the claims if they have structural elements that do not differ from the literal language of the claims, or if they include equivalent structural elements with insubstantial differences from the literal language of the claims.

As used herein, an element or step recited in the singular and proceeded with the word "a" or "an" should be understood as not excluding plural of the elements or steps, unless such exclusion is explicitly stated. Furthermore, references to "one embodiment" of the present invention are not intended to be interpreted as excluding the existence of additional embodiments that also incorporate the recited features. Moreover, unless explicitly stated to the contrary, embodiments "comprising," "including," or "having" an element or a plurality of elements having a particular property may include additional such elements not having that property.

Since certain changes may be made in the above-described apparatus and methods, without departing from the spirit and scope of the invention herein involved, it is intended that all of the subject matter of the above description or shown in the accompanying drawings shall be interpreted merely as examples illustrating the inventive concept herein and shall not be construed as limiting the invention.

What is claimed is:

1. An apparatus for decoupling a receive coil from a transmit coil, comprising:
   a tuning circuit connected electrically with the receive coil, the tuning circuit including a plurality of tuning elements;
   a MEMS switch connected electrically in parallel with the tuning circuit, and operable to line up or to bypass the tuning circuit by opening or closing the MEMS switch; and
   a control circuit operatively connected with the MEMS switch and operable to open or to close the MEMS within a window of time responsive to energization of the transmit coil to transmit a signal;
   wherein the MEMS switch includes a plurality of MEMS switches each connected electrically with a respective one of the plurality of tuning elements, and operable to line up or to bypass the respective tuning element by opening or closing the MEMS switch; and
   wherein the control circuit is operable to open or to close each of the plurality of MEMS switches, so as to tune the receive coil to one of a plurality of receive frequencies for coupling or decoupling the receive coil from the transmit coil.

2. The apparatus of claim 1 wherein the plurality of tuning elements are connected electrically in series; and each of the plurality of tuning elements is connected electrically in parallel with at least one of the plurality of MEMS switches.

3. The apparatus of claim 2 wherein at least two MEMS switch are connected electrically in parallel with the tuning circuit.

4. The apparatus of claim 1 wherein the plurality of tuning elements are connected electrically in parallel; and each of the plurality of tuning elements is connected electrically in series with at least one of the plurality of MEMS switches.

5. The apparatus of claim 1 wherein at least one of the plurality of tuning elements is a reactive element.

6. The apparatus of claim 1 wherein the tuning circuit is a reactive element.

7. The apparatus of claim 1 wherein the control circuit is operatively connected with the MEMS switch and is operable to close the MEMS switch for bypassing the tuning circuit, within said window of time, so as to couple the receive coil to the transmit coil during only that window of time.

8. An apparatus for decoupling a receive coil from a transmit coil, comprising:
 a plurality of tuning elements connected electrically with the receive coil;
 a plurality of MEMS switches each connected electrically with a respective one of the plurality of tuning elements, and operable to line up or to bypass the respective tuning circuit by opening or closing the MEMS switch; and
 a control circuit operatively connected with the MEMS switch and operable to open or to close each of the plurality of MEMS switches, so as to tune the receive coil to any of one or more non-receive frequencies for decoupling the receive coil from the transmit coil, or to a receive frequency for coupling the receive coil to the transmit coil.

9. The apparatus of claim 8 wherein the plurality of tuning elements are connected electrically in series, and each of the plurality of tuning elements is connected electrically in parallel with at least one of the plurality of MEMS switches.

10. The apparatus of claim 9 wherein at least two MEMS switch are connected electrically in parallel with each of the plurality of tuning elements.

11. The apparatus of claim 8 wherein the control circuit is operable to open or to close each of the plurality of MEMS switches for bypassing some or all of the plurality of tuning elements, within a window of time following energization of the transmit coil, so as to couple the receive coil to the transmit coil during only said window of time.

12. The apparatus of claim 11 wherein the control circuit is operatively connected to permit transmission of an RF pulse via the transmit coil, or to prevent transmission of the RF pulse during said window of time.

13. The apparatus of claim 11 wherein the control circuit is operable to close the plurality of MEMS for bypassing the plurality of tuning elements so as to couple the receive coil to the transmit coil.

14. The apparatus of claim 8 wherein at least one of the plurality of tuning elements is a reactive element.

15. An receive coil array apparatus comprising:
 a plurality of receive coils;
 a plurality of tuning elements each connected electrically with a respective one of the receive coils;
 a plurality of MEMS switches each connected electrically with a respective one of the plurality of tuning elements, and operable to line up or to bypass the respective tuning circuit by opening or closing the MEMS switch; and
 a control circuit operatively connected with each of the plurality of MEMS switches to selectively enable and disable the plurality of MEMS switches, wherein the control circuit is programmed to:
  disable the plurality of MEMS switches so as to decouple the plurality of receive coils from a transmit coil during a transmit mode of operation;
  detect termination of the transmit mode of operation;
  implement a blanking delay period upon detecting termination of the transmit mode of operation; and
  enable the plurality of MEMS switches after the blanking delay period and for a duration of a receive delay period, so as to couple the plurality of receive coils to the transmit coil, whereafter the plurality of MEMS switches is again disabled.

16. The apparatus of claim 15 wherein the control circuit is operable to:
 open each of the plurality of MEMS switches, via disabling thereof, to tune the receive coil to any of one or more non-receive frequencies for decoupling the receive coil from the transmit coil; and
 close each of the plurality of MEMS switches, via enabling thereof, to tune the receive coil to a receive frequency for coupling the receive coil to the transmit coil.

17. The apparatus of claim 16 wherein the a collective length of the blanking delay period and the receive delay period is less than one MRI scan cycle in length.

18. The apparatus of claim 17 wherein the control circuit is programmed to operate the transmit coil in a transmit non-permissive state during the receive delay period, so as to prevent transmission of an RF pulse during said receive delay period.

19. The apparatus of claim 17 wherein the control circuit is programmed to operate the transmit coil in a transmit permissive state upon decoupling of the plurality of receive coils from the transmit coil.

20. A method for coupling and decoupling a receive coil with a transmit coil, the method implemented by a control-circuit and comprising:
 maintaining the receive coil decoupled from the transmit coil by operating one or more MEMS switches in an open position;
 detecting an RF pulse transmission via the transmit coil;
 responsive to the RF pulse transmission, coupling the receive coil to the transmit coil during a window of time by operating the one or more MEMS switches in a closed position; and
 after the window of time, decoupling the receive coil from the transmit coil by operating the one or more MEMS switches in the open position.

* * * * *